(12) United States Patent
Zhao et al.

(10) Patent No.: US 7,381,660 B2
(45) Date of Patent: Jun. 3, 2008

(54) DIELECTRIC BARRIER LAYER FOR A COPPER METALLIZATION LAYER HAVING A VARYING SILICON CONCENTRATION ALONG ITS THICKNESS

(75) Inventors: Larry Zhao, Austin, TX (US); Jeremy Martin, Austin, TX (US); Hartmut Ruelke, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/717,122

(22) Filed: Nov. 19, 2003

(65) Prior Publication Data

US 2004/0152333 A1 Aug. 5, 2004

(30) Foreign Application Priority Data

Jan. 31, 2003 (DE) ................. 103 03 925

(51) Int. Cl.
*H01L 21/44* (2006.01)
*H01L 21/31* (2006.01)

(52) U.S. Cl. ............... 438/791; 438/687; 438/763; 438/792

(58) Field of Classification Search ............... 438/687, 438/763, 792, 791
See application file for complete search history.

(56) References Cited

U.S. PATENT DOCUMENTS

| 6,339,025 B1 | 1/2002 | Liu et al. ............ 438/687 |
| 6,548,418 B2 * | 4/2003 | Lam et al. ........... 438/723 |
| 6,656,840 B2 * | 12/2003 | Rajagopalan et al. ....... 438/687 |

FOREIGN PATENT DOCUMENTS

| EP | 1 146 140 A1 | 10/2001 |
| WO | WO 03/007368 | * 1/2003 |
| WO | WO 03/007368 A2 | 1/2003 |

* cited by examiner

*Primary Examiner*—Alexander G Ghyka
(74) *Attorney, Agent, or Firm*—Williams, Morgan & Amerson, P.C.

(57) ABSTRACT

A silicon nitride layer having a silicon-rich sub-layer and a standard sub-layer is formed on a copper surface to obtain excellent electromigration characteristics due to the standard sub-layer that is in contact with the copper, while maintaining a superior diffusion barrier behavior due to the silicon-rich sub-layer. By combining these sub-layers, the overall thickness of the silicon nitride layer may be kept small compared to conventional silicon nitride barrier layers, thereby reducing the capacitive coupling of adjacent copper lines.

18 Claims, 2 Drawing Sheets

DIELECTRIC BARRIER LAYER FOR A COPPER METALLIZATION LAYER HAVING A VARYING SILICON CONCENTRATION ALONG ITS THICKNESS

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material.

2. Description of the Related Art

In modern integrated circuits, minimum feature sizes, such as the channel length of field effect transistors, have reached the deep sub-micron range, thereby steadily increasing performance of these circuits in terms of speed and power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip. In integrated circuits having minimum dimensions of approximately 0.35 μm and less, a limiting factor of device performance is the signal propagation delay caused by the switching speed of the transistor elements. As the channel length of these transistor elements has now reached 0.18 μm and less, it turns out, however, that the signal propagation delay is no longer limited by the field effect transistors, but is limited, owing to the increased circuit density, by the close proximity of the interconnect lines, since the line-to-line capacitance is increased in combination with a reduced conductivity of the lines due to their reduced cross-sectional area. The parasitic RC time constants therefore require the introduction of a new type of material for forming the metallization layer.

Traditionally, metallization layers are formed by a dielectric layer stack including, for example, silicon dioxide and/or silicon nitride with aluminum as the typical metal. Since aluminum exhibits significant electromigration at higher current densities than may be necessary in integrated circuits having extremely scaled feature sizes, aluminum is being replaced by copper, which has a significantly lower electrical resistance and a higher resistivity against electromigration.

The introduction of copper, however, entails a plurality of issues to be dealt with. For example, copper may not be deposited in higher amounts in an efficient manner by well-established deposition methods, such as chemical and physical vapor deposition. Moreover, copper may not be efficiently patterned by well-established anisotropic etch processes and therefore the so-called damascene technique is employed in forming metallization layers including copper lines. Typically, in the damascene technique, the dielectric layer is deposited and then patterned with trenches and vias that are subsequently filled with copper by plating methods, such as electroplating or electroless plating.

A further issue is the ability of copper to readily diffuse in silicon dioxide. Therefore, copper diffusion may negatively affect device performance, or may even lead to a complete failure of the device. It is therefore necessary to provide a diffusion barrier layer between the copper surfaces and the neighboring materials to substantially prevent copper from migrating to sensitive device regions.

Silicon nitride is known as an effective copper diffusion barrier, and is thus frequently used as a dielectric barrier material separating a copper surface from an interlayer dielectric, such as silicon dioxide.

Although copper exhibits superior characteristics with respect to resistance to electromigration compared to, for example, aluminum, the ongoing shrinkage of feature sizes, however, leads to a reduction in copper lines and thus to increased current densities in these lines, thereby causing a non-acceptable degree of electromigration. Electromigration is a diffusion phenomenon occurring under the influence of an electric field, which leads to a copper diffusion in the direction of the moving charge carriers, thereby finally producing voids in the copper lines that may cause device failure. It has been confirmed that these voids typically originate at the copper silicon nitride interface and represent one of the most dominant diffusion paths in copper metallization structures. It is therefore of great importance to produce high quality interfaces between the copper and the silicon nitride barrier layer to reduce the electromigration to an acceptable degree.

As previously noted, the device performance of extremely scaled integrated circuits is substantially limited by the parasitic capacitances of adjacent interconnect lines, which may be reduced by decreasing the resistivity thereof and by decreasing the capacitive coupling in that the overall dielectric constant of the dielectric layer is maintained as low as possible. Since silicon nitride has a relatively high dielectric constant k of approximately 7 compared to silicon dioxide ($k \mp 4$) or other silicon dioxide based low-k dielectric layers ($k<4$), it is generally preferable to form the silicon nitride layer with a minimum thickness. It turns out, however, that the barrier characteristics of the silicon nitride layer depend on the thickness thereof so that thinning the silicon nitride layer, as would be desirable for a reduced overall dielectric constant, may not be practical to an extent as required for further scaling semiconductor devices including copper metallization layers without compromising device performance.

In light of the above-specified problems, a need exists for an improved technique that allows the formation of a dielectric barrier layer on the basis of silicon nitride, exhibiting an improvement with respect to diffusion barrier efficiency and/or resistance to electromigration.

SUMMARY OF THE INVENTION

The present invention is generally based on the concept that a silicon-rich silicon nitride layer exhibits superior copper diffusion barrier characteristics compared to a standard silicon nitride layer. It has been found that an interface between a standard silicon nitride layer and a copper surface may have a superior resistance against electromigration than does a silicon-rich silicon nitride/copper interface. By taking advantage of the above effects, a dielectric barrier layer on the basis of silicon nitride may be formed having enhanced diffusion barrier and electromigration characteristics for a given thickness compared to a conventional silicon nitride layer, or having a reduced overall thickness for a given degree of barrier and electromigration characteristics, in that a standard silicon nitride layer and a silicon-rich silicon nitride layer are combined to form a dielectric barrier layer.

According to one illustrative embodiment of the present invention, therefore, a semiconductor structure comprises a dielectric layer and a metal-containing region formed in the dielectric layer, wherein the metal-containing region comprises at least one copper surface. Moreover, a silicon and nitrogen-containing dielectric barrier layer is formed on the copper surface, wherein the silicon and nitrogen-containing barrier layer has a first surface in contact with the copper surface and a second distal surface, whereby a silicon concentration at the second surface is greater than the silicon concentration at the first surface of the barrier layer.

According to a further illustrative embodiment of the present invention, a method of forming a dielectric barrier layer comprises forming a first silicon nitride layer on an exposed copper surface and forming a second silicon nitride layer on the first silicon nitride layer. Moreover, a silicon concentration of the first and second silicon nitride layers is adjusted so that—at least partially—the silicon concentration of the second silicon nitride layer is higher than that of the first silicon nitride layer.

BRIEF DESCRIPTION OF THE DRAWINGS

The invention may be understood by reference to the following description taken in conjunction with the accompanying drawings, in which like reference numerals identify like elements, and in which.

Figure 1A:
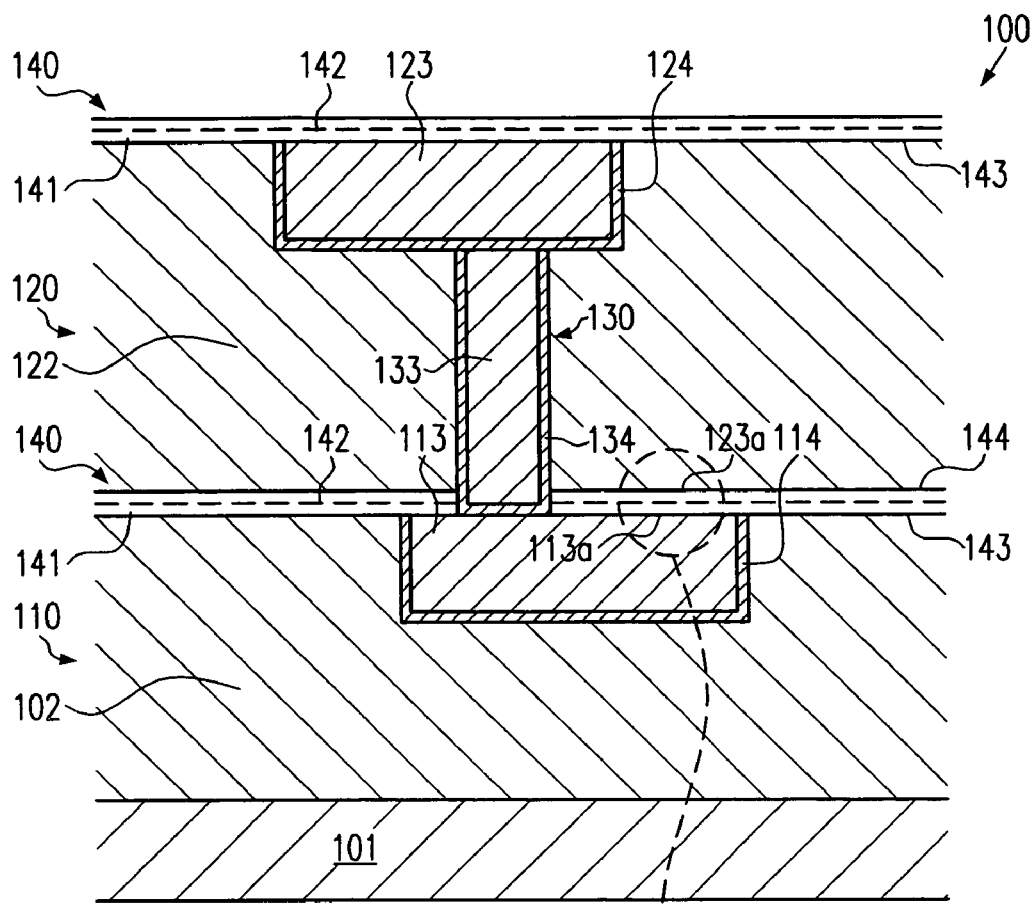
FIGS. 1a-1c schematically show cross-sectional views of a semiconductor device including a copper metallization with a dielectric barrier layer in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As previously noted, it was recognized that, by varying the silicon contents of a silicon nitride layer, the characteristics thereof with respect to barrier qualities and resistance against electromigration may be significantly changed, wherein, in particular, the barrier characteristics of a silicon-rich silicon nitride layer remarkably exceed that of a standard silicon nitride layer, i.e., a silicon nitride layer substantially representing the normal stoichiometric ratio of silicon and nitride. For example, a silicon-rich silicon nitride layer may provide improved barrier characteristics compared to a standard silicon nitride layer having a thickness that is approximately twice that of the silicon-rich layer. Increasing the silicon contents of a standard silicon nitride layer may, however, lead to a reduced resistance against electromigration of a corresponding copper/silicon nitride interface, thereby resulting in a reduced device reliability. Based on these results, a silicon nitride barrier layer is provided having a relatively thin portion or sub-layer that is in contact with the copper to form a high quality interface therewith, wherein the silicon contents is adjusted to provide desired characteristics with respect to electromigration, whereas a second thicker portion or sub-layer comprises a higher silicon concentration that offers superior diffusion barrier characteristics.

Figure 1B:
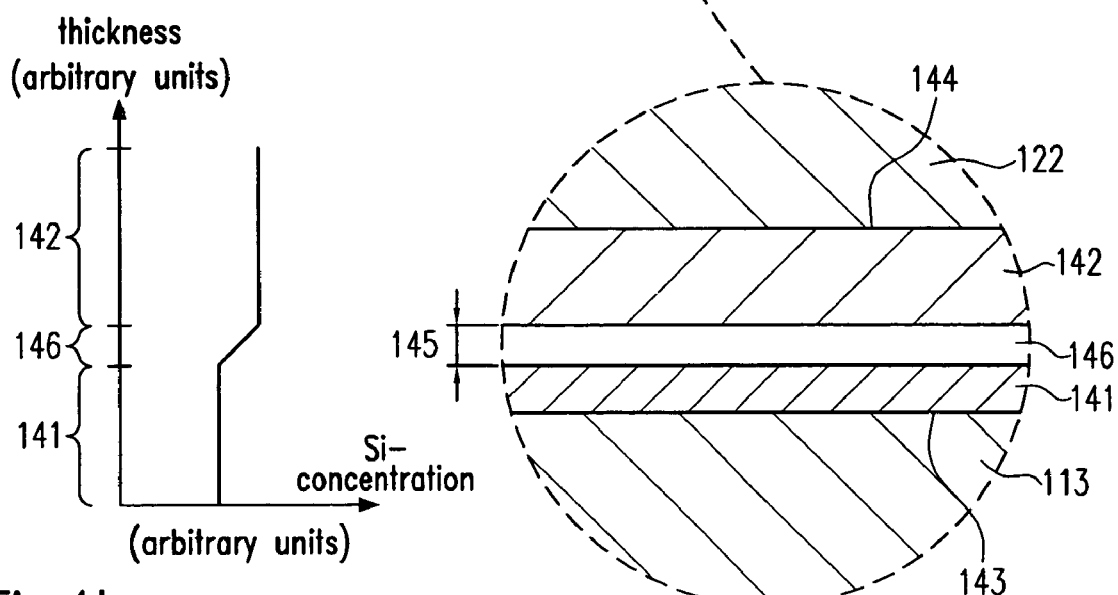
Figure 1C:
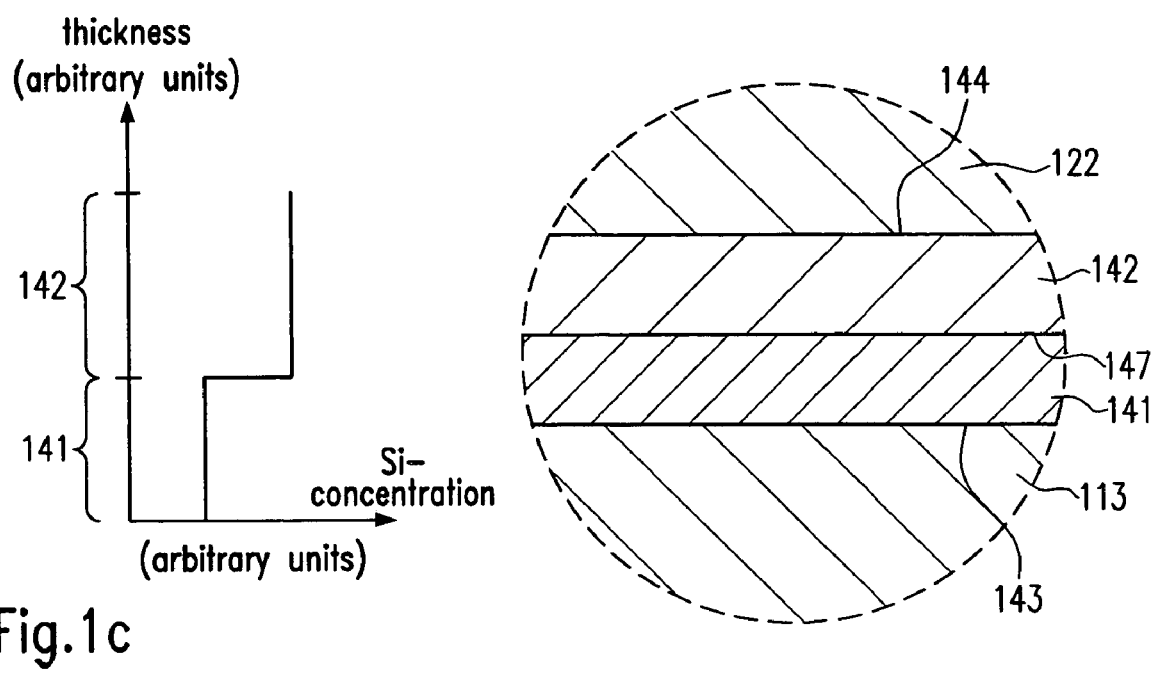

With reference to FIGS. 1a-1c, further illustrative embodiments of the present invention will now be described in more detail. In FIG. 1a, a semiconductor device 100 comprises a substrate 101 that may have formed therein or thereon a plurality of circuit elements, such as transistors, capacitors, resistors and the like. The substrate 101 may be any appropriate substrate for fabricating semiconductor devices and may particularly represent a silicon substrate, a silicon-on-insulator (SOI) substrate and the like. A first metallization layer 110 and a second metallization layer 120 are formed above the substrate 101 and may comprise electric contacts (not shown) to the substrate 101. The first and second metallization layers 110, 120 represent any metallization structure typically used in advanced semiconductor devices including copper as the metallization metal. The present invention is, however, not limited to a specific configuration or number of metallization layers provided and may be employed in any situation that requires the insulation of copper from a dielectric material in which copper readily diffuses. Thus, the principles of the present invention may also be applied to any copper or copper-containing region formed, for example, on a circuit layer, that is, a level on which circuit elements are formed, or the present invention may as well be applied to copper or copper-containing contact pads that may be used for future device generations in providing electrical contact to a device package by means of flip-chip bonding and the like.

The first metallization layer 110 includes a dielectric layer 102 comprised of, for example, silicon dioxide, a low-k material, such as hydrogen-containing silicon oxycarbide (SiCOH) in any form, and the like. A first copper region 113 is formed within the first dielectric layer 102 and is separated therefrom by a conductive barrier layer 114, for example comprised of tantalum, tantalum nitride, titanium, titanium nitride and the like.

Similarly, the second metallization layer 120 comprises a second dielectric layer 122 in which there is formed a second copper region 123 that is separated from the second dielectric layer 122 by a conductive barrier layer 124. The second metallization layer 120 may have, in principle, substantially the same configuration as the first metallization layer, wherein, however, the dimensions of the various components may vary in accordance with design requirements. For instance, the dimensions of the copper region 123 may differ from those of the copper region 113. The first and the second metallization layers 110, 120 are electrically connected to each other by a via 130 formed in the second dielectric layer 122, wherein the via 130 is filled with copper 133 that is enclosed by a conductive barrier layer 134. The first and the second metallization layers 110, 120 are separated from each other by a dielectric diffusion barrier layer 140, which comprises a first sub-layer 141 and a second sub-layer 142 formed over the first sub-layer 141. The diffusion barrier layer 140 comprises silicon and nitrogen, wherein a concentration of silicon in the first sub-layer 141, at least at an interface 143 to the copper region 113, is less than the silicon concentration of the second sub-layer 142, at least at an interface 144 to the second dielectric layer 122.

Similarly, the second dielectric layer 122 as well as the second copper region 123 are capped by a silicon and nitrogen-containing barrier layer that may have a similar configuration as the barrier layer 140 and is therefore indicated by the same reference numeral.

As is evident from FIG. 1a, the copper regions 113, 123 have at least one surface 113A, 123A that is in contact with a dielectric material, that is the sub-layer 141 of the barrier layer 140, which provides excellent resistance against electromigration due to the silicon concentration corresponding to a standard silicon nitride layer, thereby forming the excellent interface 143 with the copper regions 113, 123, respectively. In one embodiment, the stoichiometric ratio of silicon to nitrogen at the interface 143 may be in the range of approximately 0.2 to 0.45. On the other hand, the second sub-layer 142 provides excellent copper diffusion barrier qualities due to its increased silicon concentration, wherein, for example, the silicon to nitrogen ratio at the interface 144 may be in the range of approximately 0.45 to 0.8. The silicon concentration within the second sub-layer 142 may vary throughout its thickness, but it is preferably within the above-specified range.

In one embodiment, the total thickness of the barrier layer 140 is in the range of approximately 20-80 nm, wherein the first sub-layer 141 has a thickness of approximately 2-10 nm. In one particular embodiment, a thickness of the first sub-layer 141 is selected to be approximately 5 nm. Due to the improved barrier characteristics of the second silicon-rich sub-layer 142, the overall thickness of the barrier layer 140 may be reduced to about 50% compared to a conventional silicon nitride layer so that the deleterious effect of the capacitive coupling of the first and second copper regions 123, 113 may be reduced. Decreasing the thickness of the barrier layer 140 may also allow the reduction of the thickness of the first and second metallization layers 110, 120, which may be necessary in further shrinking the feature sizes of circuit elements (not shown) in the substrate 101, also requiring a shrinkage of interconnect lines, such as the via 130.

A typical process flow for forming the semiconductor device 100 as illustrated in FIG. 1a will now be described by only referring to the first metallization layer 110, since the second metallization layer 120 may be formed by substantially the same process steps, except for the formation of the via 130, which, however, is a well-known procedure in standard damascene technologies. First, the dielectric layer 102 is formed by an appropriate deposition method or coating technique, depending on the type of material used for the dielectric layer 102. For instance, silicon dioxide may be deposited from TEOS in a plasma-enhanced chemical vapor deposition (CVD) process. For other dielectric materials, such as SiCOH, a corresponding plasma-enhanced CVD process with precursors such as 3MS, 4MS in combination with oxygen, and the like may be used. Other appropriate low-k dielectric materials may require a spin-on technique, these being well known in the art. Thereafter, an etch mask (not shown) may be formed of photoresist by a photolithography step, wherein the etch mask is then used to form a trench in the first dielectric layer 102. Corresponding photolithography and anisotropic etch techniques are well known in the art and thus a detailed description thereof is omitted. Subsequently, the conductive barrier layer 114 is deposited by, for example, physical vapor deposition such as sputter deposition, wherein, depending on process requirements, a tantalum layer, a tantalum nitride layer or a combination thereof is commonly used as a barrier material for copper-based metallization layers. However, any other conductive barrier layer may be used that provides the desired barrier and adhesion characteristics for copper.

Then, a copper seed layer (not shown) may be deposited by sputter deposition followed by a plating process to fill the trench with copper. After the copper deposition, excess material, i.e., the plated copper, the seed layer and the barrier layer outside the trench, are removed by chemical mechanical polishing (CMP) to form the copper region 113 having the exposed copper surface 113A. Next, the barrier layer 140 is deposited over the dielectric layer 102 and the copper region 113. To this end, in one embodiment, the semiconductor device 100 is first treated in a plasma ambient to reduce the exposed copper surface 113A in order to remove copper oxide portions that may have formed thereon during the CMP and the subsequent rinsing and substrate handling steps. For example, an ammonia-containing plasma and/or a nitrogen and hydrogen-containing plasma ambient may be established to reduce the oxide portions of the copper surface 113A. Removing corrosion and discoloration from the copper surface 113A may help to further improve the quality of the interface 143 between the first sub-layer 141 of the barrier layer 140 and the copper surface 113A, thereby further enhancing the resistance against electromigration. Thereafter, a deposition atmosphere may be established around the semiconductor device 100 to form the barrier layer 140.

In one embodiment, the deposition atmosphere is established without breaking the vacuum created during the plasma treatment of the exposed copper surface 113A. A corresponding process sequence, in which substantially identical negative pressure conditions are maintained without "flooding" the substrate's ambient to substantially atmospheric pressure, will also be referred to as an in situ process. Then, irrespective of whether or not the plasma treatment has been carried out, an appropriate deposition atmosphere is established to form the first sub-layer 141 of the barrier layer 140. The first sub-layer 141 may be deposited by plasma-enhanced CVD from precursor gases such as silane ($SiH_4$) and ammonia ($NH_3$). The deposition parameters, such as precursor concentration in the deposition ambient, that is, flow rate and ambient pressure, substrate temperature, radio frequency (RF) power supplied to the ambient to create a plasma, duration of the deposition process, and the like are selected so as to obtain a desired thickness for the first sub-layer 141 in the range of approximately 2-10 nm. In one embodiment, the flow rates of silane ($SiH_4$) and ammonia (NH3) may be adjusted to approximately 120-170 and approximately 220-300 sccm, respectively, while, additionally, an inert gas, such as nitrogen, is supplied with a flow rate in the range of approximately 8000-9000 sccm. With an RF power of approximately 400-600 Watts for a CVD tool as typically used in semiconductor fabrication, and a pressure of the deposition atmosphere of approximately 4-6 Torr with a substrate temperature in the range of approximately 350-450° C., a deposition time may range from approximately 1-3 seconds. It should be noted that the deposition parameters may depend on the specific deposition tool used and thus other parameter values than specified above may be appropriate as long as the concentration value given above may be obtained.

Next, the parameter setting is changed to correspond to the deposition of the second sub-layer 142 having an increased silicon concentration compared to the first sub-layer 141, wherein particularly the flow rates of the precursors, such as silane ($SiH_4$) and ammonia ($NH_3$), are correspondingly adapted so as to provide a higher silicon concentration in the deposition atmosphere. In one embodiment, the silane ($SiH_4$) flow rate is adjusted to approximately 200-250 sccm, whereas the ammonia ($NH_3$) flow rate is reduced to approximately 30-80 sccm. The deposition time is adjusted to obtain the required final thickness of the barrier layer 140. In one embodiment, the RF power may be set to approximately 450-550 Watts, and the flow rate of nitrogen is adjusted to approximately 7000-8000 sccm. For these parameters, a deposition time of 4-8 seconds yields a thickness in the above-specified range.

In one embodiment, the transition from the parameter values required for the deposition of the first sub-layer 141 to the parameters required for the deposition of the second sub-layer 142 is carried out without discontinuing the deposition process so that a layer with a gradually increasing silicon concentration is formed in the barrier layer 140.

FIG. 1b schematically shows a magnified view of a portion of the semiconductor structure 100 of FIG. 1a. Due to the ongoing deposition during the parameter readjustment, an intermediate layer 146 may be formed between the first sub-layer 141 and the second sub-layer 142. A thickness of the intermediate layer 146 depends on the specifics of the transition step for the parameter readjustment. It may be advantageous to readjust the deposition parameters in a substantially step-like manner so that a thickness 145 of the intermediate layer 146 depends on the time required for the deposition atmosphere to reach its new equilibrium state. In other embodiments, it may be considered appropriate to continuously vary one or more process parameters during the transition step. The thickness 145 of the intermediate layer 146 may be in the range of approximately 0.5-1 nm.

On the left-hand side of FIG. 1b, a graph is shown that schematically depicts a typical variation of the silicon concentration within the barrier layer 140. The vertical axis represents the thickness of the first and the second sub-layers 141 and 142 and of the intermediate layer 146. The horizontal axis represents the silicon concentration thereof. As is evident, the silicon concentration may increase within the intermediate layer 146 until a substantially stable deposition rate is achieved in the deposition atmosphere, thereby forming the second sub-layer 142 with a substantially constant silicon concentration.

FIG. 1c schematically shows a magnified view of a portion of the semiconductor device 100 as shown in FIG. 1a, wherein the barrier layer 140 is formed in accordance with a further illustrative embodiment. In FIG. 1c, the barrier layer 140 comprises the first and the second sub-layers 141, 142 with a relatively sharp interface 147 formed therebetween. To this end, the deposition process in forming the first sub-layer 141 is discontinued, for example, by disconnecting the supply of radio frequency power to the deposition atmosphere, and then the deposition parameters are readjusted within a specified transition step to allow the deposition atmosphere to assume its new equilibrium state. For instance, the RF power may be switched off and the flow rates of the precursor gases and possibly a pressure of the deposition atmosphere may be adjusted to the parameters values required for the deposition of the second sub-layer 142. Then, a time interval in the range of approximately 3-10 seconds may be provided to establish essentially stable deposition conditions and the RF power may be switched on with a required specified value.

The left-hand side of FIG. 1c schematically shows a graph representing the silicon concentration with respect to the thickness of the barrier layer 140 in accordance with the above-described step-like deposition process. It should be noted that the step-like change in the silicon concentration as illustrated in FIG. 1c may be somewhat "blurred" in actual devices due to start-up effects in beginning a new deposition cycle and owing to unavoidable diffusion events of silicon and nitrogen at the interface 147, caused by elevated temperatures and the concentration difference between the first and second sub-layers 141, 142. Thus, in actual devices, the silicon concentration may vary within a few angstrom.

As a result, the present invention allows the formation of a silicon nitride based barrier layer having improved characteristics with respect to resistance against electromigration as well as copper diffusion, wherein the overall thickness of the barrier layer may be significantly reduced compared to conventional silicon nitride layers, since a first portion of the barrier layer in contact with the copper provides for an improved interface quality, whereas a second portion is designed to yield an enhanced diffusion barrier effect.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a silicon and nitrogen containing dielectric barrier layer comprising a first sub-layer containing silicon and nitrogen, a second sub-layer containing silicon and nitrogen, and an intermediate sub-layer containing silicon and nitrogen positioned between said first and second sub-layers, the method comprising:

providing a structure comprising an exposed copper surface; and performing at least one deposition process to form said first, second and intermediate sub-layers above said exposed copper surface, said first sub-layer having a first surface that interfaces with said exposed copper surface, said intermediate layer having a surface that interfaces with said first sub-layer, said second sub-layer having a first surface that interfaces with said intermediate layer and a second surface that is opposite said first surface of said second sub-layer, wherein the parameters of said at least one deposition process are adjusted such that a concentration of silicon in said first sub-layer is less than a concentration of silicon in said second sub-layer.

2. The method of claim 1, wherein said at least one deposition process is a single deposition process that is performed without interrupting a vacuum.

3. The method of claim 1, wherein said concentration of silicon in said first sub-layer is substantially constant throughout its thickness, said concentration of silicon in said second sub-layer is substantially constant throughout its thickness, and a concentration of silicon in said intermediate sub-layer increases in the direction from its interface with the first sub-layer to its interface with the second sub-layer.

4. The method of claim 1, wherein performing said at least one deposition process comprises performing said at least one deposition process with a first set of a deposition parameters to form said first sub-layer and transitioning to performing said at least one deposition process with a second set of deposition parameters that are different from said first set of deposition parameters to thereby form said second sub-layer.

5. The method of claim 4, wherein said first and second set of deposition parameters include at least one of a silane flow rate and an ammonia flow rate.

6. The method of claim 3, wherein a stoichiometric ratio of silicon to nitrogen at said first surface of said first sub-layer is within the range of approximately 0.2-0.45.

7. The method of claim 1, further comprising treating said exposed copper surface by exposing the copper surface to a plasma ambient prior to forming said first sub-layer.

8. The method of claim 7, wherein treating said exposed copper surface and forming said first, second and intermediate sub-layers is performed without interrupting a vacuum established over said exposed copper surface.

9. The method of claim 6, wherein a stoichiometric ratio of silicon to nitrogen at said second surface of said second sub-layer is within the range of approximately 0.45-0.8.

10. A method of forming a silicon and nitrogen containing dielectric barrier layer comprising a first sub-layer containing silicon and nitrogen, a second sub-layer containing silicon and nitrogen, and an intermediate sub-layer containing silicon and nitrogen positioned between said first and second sub-layers, the method comprising:

providing a structure comprising an exposed copper surface;

treating said exposed copper surface by exposing the copper surface to a plasma ambient; and after treating said exposed copper surface, performing at least one deposition process to form said first, second and intermediate sub-layers above said exposed copper surface, said first sub-layer having a first surface that interfaces with said exposed copper surface, said intermediate layer having a surface that interfaces with said first sub-layer, said second sub-layer having a first surface that interfaces with said intermediate layer and a second surface that is opposite said first surface of said second sub-layer, wherein the parameters of said at least one deposition process are adjusted such that a concentration of silicon in said first sub-layer is substantially constant throughout its thickness, said concentration of silicon in said second sub-layer is substantially constant throughout its thickness, the concentration of silicon in said second sub-layer being greater than the concentration of silicon in said first sub-layer, wherein the step of treating said exposed copper surface and performing said at least one deposition process are performed without interrupting a vacuum established over said exposed copper surface.

11. The method of claim 10, wherein performing said at least one deposition process comprises changing a first set of deposition parameters to a second set of deposition parameters.

12. The method of claim 10, wherein performing said at least one deposition process comprises performing said at least one deposition process with a first set of a deposition parameters to form said first sub-layer and transitioning to performing said at least one deposition process with a second set of deposition parameters that are different from said first set of deposition parameters to thereby form said second sub-layer.

13. The method of claim 10, wherein a concentration of silicon in said intermediate sub-layer increases in the direction from its interface with the first sub-layer to its interface with the second sub-layer.

14. The method of claim 10, wherein a stoichiometric ratio of silicon to nitrogen at said first surface of said first sub-layer is within the range of approximately 0.2-0.45.

15. The method of claim 14, wherein a stoichiometric ratio of silicon to nitrogen at said second surface of said second sub-layer is within the range of approximately 0.45-0.8.

16. A method of forming a silicon and nitrogen containing dielectric barrier layer comprising a first sub-layer containing silicon and nitrogen, a second sub-layer containing silicon and nitrogen, and an intermediate sub-layer containing silicon and nitrogen positioned between said first and second sub-layers, the method comprising:

providing a structure comprising an exposed copper surface; and treating said exposed copper surface by exposing the copper surface to a plasma ambient;

after treating said exposed copper surface, performing a single deposition process in which deposition parameters are changed to form said first, second and intermediate sub-layers above said exposed copper surface, said first sub-layer having a first surface that interfaces with said exposed copper surface, said intermediate layer having a surface that interfaces with said first sub-layer, said second sub-layer having a first surface that interfaces with said intermediate layer, and a second surface that is opposite said first surface of said second sub-layer, wherein said parameters of said deposition process are changed such that a concentration of silicon in said first sub-layer is substantially constant throughout its thickness, said concentration of silicon in said second sub-layer is substantially constant throughout its thickness, and a concentration of silicon in said intermediate sub-layer increases in the direction from its interface with the first sub-layer to its interface with the second sub-layer, wherein a stoichiometric ratio of silicon to nitrogen at said first surface of said first sub-layer is within the range of approximately 0.2-0.45, and wherein a stoichiometric ratio of silicon to nitrogen at said second surface of said second sub-layer is within the range of approximately 0.45-0.8.

17. The method of claim 16, wherein said single deposition process is performed without interrupting a vacuum.

18. The method of claim 16, wherein the concentration of silicon in said second sub-layer is greater than the concentration of silicon in said first sub-layer.

* * * * *